(12) United States Patent
Kong et al.

(10) Patent No.: US 10,566,204 B2
(45) Date of Patent: *Feb. 18, 2020

(54) ETCHING AND MECHANICAL GRINDING FILM-LAYERS STACKED ON A SEMICONDUCTOR SUBSTRATE

(71) Applicant: TEXAS INSTRUMENTS INCORPORATED, Dallas, TX (US)

(72) Inventors: Jian Jun Kong, Sichuan (CN); She Yu Tang, Sichuan (CN); Tian Yi Zhang, Sichuan (CN); Qin Xu Yu, Chengdu (CN); Sheng Pin Yang, Chengdu (CN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 16/282,344

(22) Filed: Feb. 22, 2019

(65) Prior Publication Data

US 2019/0214263 A1    Jul. 11, 2019

Related U.S. Application Data

(63) Continuation of application No. 15/864,802, filed on Jan. 8, 2018, now Pat. No. 10,249,504, which is a
(Continued)

(51) Int. Cl.
*H01L 21/304* (2006.01)
*H01L 21/311* (2006.01)
(Continued)

(52) U.S. Cl.
CPC ...... *H01L 21/304* (2013.01); *H01L 21/31111* (2013.01); *H01L 21/32134* (2013.01);
(Continued)

(58) Field of Classification Search
CPC .................................................. H01L 21/304
(Continued)

(56) References Cited

U.S. PATENT DOCUMENTS 10,249,504 B2 * 4/2019 Kong ............... H01L 21/304
2012/0252212 A1 10/2012 Nishida

FOREIGN PATENT DOCUMENTS

CN       101075559      11/2007
CN       102074472       5/2011
(Continued)

OTHER PUBLICATIONS

Patent Cooperation Treaty International Search Report, dated May 31, 2018, International Application No. PCT/CN2017/099571, filed Aug. 30, 2017.

*Primary Examiner* — Roberts P Culbert
(74) *Attorney, Agent, or Firm* — Andrew R. Ralston; Charles A. Brill; Frank D. Cimino

(57) ABSTRACT

In some embodiments, a method of forming an integrated circuit includes providing a semiconductor substrate having an electronic circuit formed on a front side, and having a first material layer located over a second side of the substrate and a second material layer located between the first material layer and the second side. At least a portion of the first material layer is removed using a first chemical etching process, thereby exposing the second material layer. At least a portion of the second material layer is removed using a second chemical etching process. A portion of the substrate is then mechanically removed from the second side.

15 Claims, 3 Drawing Sheets

Related U.S. Application Data continuation of application No. PCT/CN2017/099571, filed on Aug. 30, 2017.

(51) Int. Cl.
*H01L 21/683* (2006.01)
*H01L 21/3213* (2006.01)

(52) U.S. Cl.
CPC .. *H01L 21/6836* (2013.01); *H01L 2221/6834* (2013.01); *H01L 2221/68327* (2013.01)

(58) Field of Classification Search
USPC .......................................................... 438/691
See application file for complete search history.

(56) References Cited

FOREIGN PATENT DOCUMENTS

| | | |
|---|---|---|
| CN | 103117218 | 5/2013 |
| CN | 103606517 | 2/2014 |
| WO | 03028077 | 4/2003 |

* cited by examiner

ETCHING AND MECHANICAL GRINDING FILM-LAYERS STACKED ON A SEMICONDUCTOR SUBSTRATE

CROSS-REFERENCE TO RELATED APPLICATIONS

Under 35 U.S.C. § 120, this continuation application claims the benefit of and priority to U.S. patent application Ser. No. 15/864,802, filed Jan. 8, 2018, the entirety of which is hereby incorporated herein by reference.

BACKGROUND

Technological advancements have enabled the semiconductor industry to successfully scale down the sizes of transistors on integrated circuits, resulting in substantial reductions in integrated circuit ("IC") sizes. In addition, improved manufacturing processes have allowed circuit designers and process engineers to increase the number of transistors on ICs by increasing the sizes of the wafers.

SUMMARY

According to an embodiment, a method includes wet-etching a first film layer of a plurality of film layers stacked on a semiconductor substrate, the wet-etching of the first film layer performed using a first chemical, and the first film layer is an outermost film layer stacked on the semiconductor substrate. The method also includes wet-etching a second film layer of the plurality of film layers using a second chemical. Further the method includes using a mechanical grinding wheel to grind the semiconductor substrate to reduce a thickness of the semiconductor substrate.

According to another embodiment, a method of thinning of a semiconductor wafer includes protecting a front side of a semiconductor substrate using tape. The method further includes chemically etching a plurality of film layers stacked on the semiconductor substrate to expose the semiconductor substrate, the chemical etching performed using a first chemical selected to etch a first film layer and a second chemical selected to etch a second film layer. The method further includes grinding the semiconductor substrate to reduce a thickness of the semiconductor substrate.

According to yet another embodiment, a method includes providing a semiconductor substrate having an integrated circuit formed on a first side of the semiconductor substrate and having a silicon nitride film layer and a polysilicon film layer stacked on a second side of the substrate. The method further includes removing the silicon nitride film layer using a first chemical bath comprising 30%-49% hydrogen fluoride, inclusive. The method further includes removing the polysilicon film layer using a second chemical bath comprising 60%-70% nitric acid, inclusive and 0.5%-1% hydrogen fluoride, inclusive, to expose the semiconductor substrate. The method also includes thinning the semiconductor substrate using a mechanical grinder.

BRIEF DESCRIPTION OF THE DRAWINGS

For a detailed description of various examples, reference will now be made to the accompanying drawings in which.

DETAILED DESCRIPTION

The size of an IC chip is usually not a concern when the chip is placed in an automobile, desktop computer, or other relatively large device. However, the size of the chip is of greater importance when the chip is placed in a miniature device, such as a smartphone. A reduction in the overall size of the IC package may be achieved using high-density packaging. High-density packaging is typically done by stacking multiple integrated circuits. Package density may be further improved by reducing the thickness of the wafer—used to fabricate a few thousand ICs at once—by performing wafer backgrinding (also commonly referred to as "wafer thinning"). Wafer backgrinding involves thinning semiconductor wafers after ICs have been fabricated onto the wafer.

Mechanical wheel grinders are employed to remove unnecessary silicon substrate from the backside of the semiconductor wafer. In some cases, the backside of the semiconductor wafer includes an extraneous stack of film layers, which leads to an increase in the overall thickness of the high-density package. In such cases, a reduction in the thickness of the wafer is achieved by removing both the extraneous film layers and a portion of the silicon substrate from the backside of the wafer by mechanical wheel grinders. In some cases, the film layers on the backside of the semiconductor wafer are grind-resistant and/or hard such that the mechanical wheel grinders are damaged during the grinding process. Replacement of a damaged mechanical wheel grinder is expensive and performing semiconductor wafer thinning using a damaged wheel can further damage the semiconductor wafer. Thus, there is a need in the art for methods to prevent damage to the mechanical wheel grinders.

The present disclosure provides techniques to prevent damage to mechanical wheel grinders during the removal of film layers stacked on the backsides of semiconductor wafers. More specifically, the present disclosure relates to replacing the mechanical wheel grinding technique employed to remove the film layers present on the backsides of the wafers with a wet-etching technique. In some embodiments, backside wafer thinning is performed by first wet-etching the film layers and then wheel-grinding the semiconductor substrate to thin the substrate. In this way, the mechanical wheel grinder is not used to remove film layers—some of which have hardness characteristics equivalent to those of a diamond—from the backside of the semiconductor wafer, and so the integrity of the mechanical wheel grinder is preserved.

Figure 1A:
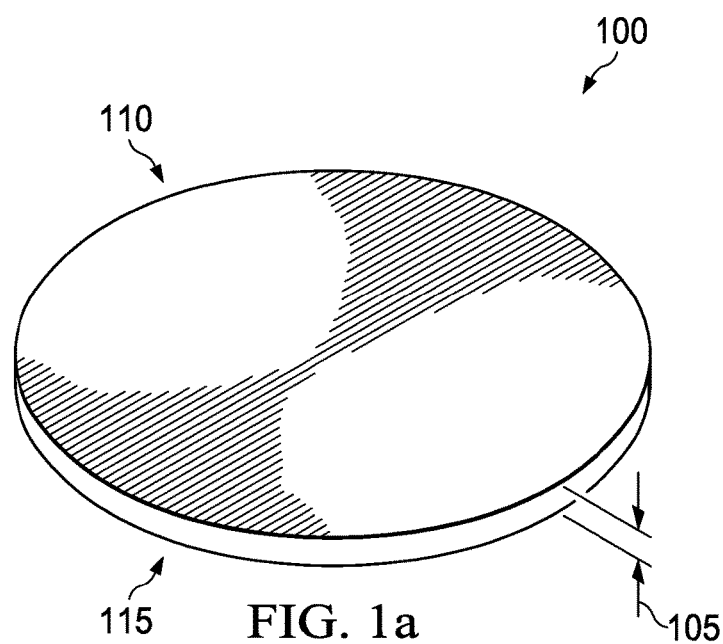
FIG. 1(a) is a perspective view of a semiconductor wafer used to manufacture integrated circuits, in accordance with various examples.

FIG. 1(a) is a perspective view of an illustrative semiconductor wafer 100 used to manufacture integrated circuits. The wafer 100 may comprise any suitable compound (e.g., silicon, gallium arsenide and indium phosphide). Although the following discussion assumes wafers made of silicon, the techniques described herein may apply to wafers made from other compounds (e.g., elements from column IV of the periodic table of elements as well as combinations of elements from columns III-V).

Fabrication processes are performed on a front side 110 of the semiconductor wafer 100 to produce a plurality of integrated circuits (not expressly depicted in FIG. 1(a)). For example, an average-sized (e.g., 300 mm) semiconductor wafer can produce thousands of ICs. As noted above, as technology leads electronics to shrink in size, IC packaged devices must be reduced both in footprint and thickness. Reduction in packaged device size is often achieved by reducing the IC thickness. For high yield, the reduction of IC thickness is often combined with an increased wafer diameter. However, a larger semiconductor diameter may sometimes require a "thicker" semiconductor wafer that can withstand the semiconductor fabrication and wafer manufacturing processes. For the semiconductor wafer 100, numeral 105, as further discussed below, depicts the wafer thickness. FIG. 1(a) also shows the backside 115 of the semiconductor wafer 100. Hard film layers are formed on and subsequently wet-etched from the backside 115, as described below.

Figure 1B:
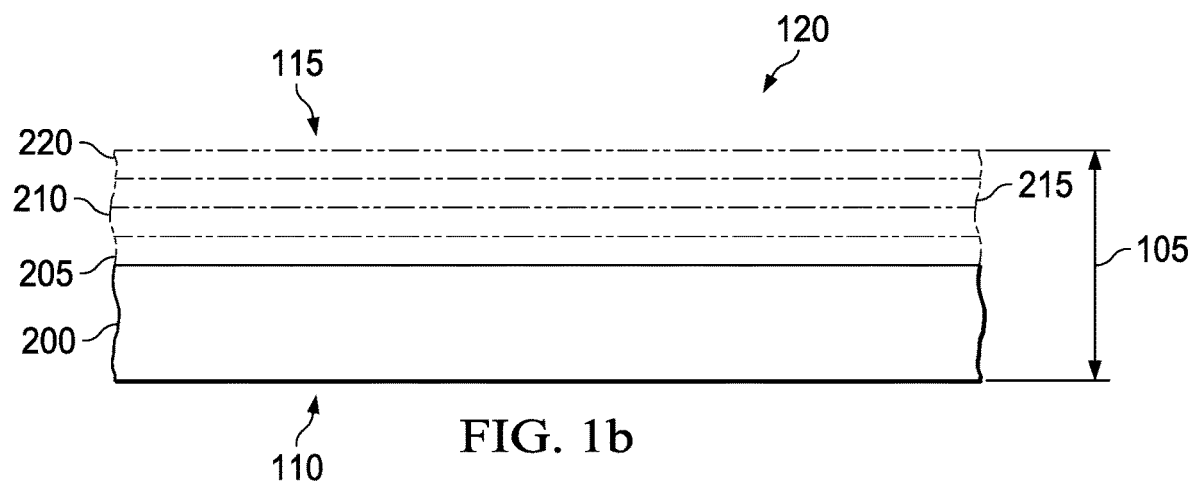
FIG. 1(b) is an inverted side view of a portion of the semiconductor wafer of FIG. 1(a), in accordance with various examples.

FIG. 1(b) is an inverted side view of a portion 120 of the semiconductor wafer 100 in accordance with some embodiments. The portion 120 is an illustrative portion of the semiconductor wafer 100 and is used to describe the fabrication process that can be performed on the wafer 100. The methods described in this disclosure can also be employed on the complete semiconductor wafer 100.

The inverted side view of the portion 120 of the wafer 100 includes a semiconductor substrate 200. The front side 110 refers to a surface of the substrate 200 opposite the film layers 205, 210, 215 and 220. The backside 115 refers to the surface of the outermost film layer 205, 210, 215, 220 opposite the substrate 200. More specifically, in FIG. 1(b), the backside 115 refers to the surface of the film layer 220 opposite the substrate 200, but during film layer removal, the film layer having the backside 115 may change. For example, when the film layer 220 is removed, the backside 115 refers to the surface of the film layer 215 opposite the substrate 200. Similarly, when film layer 215 is removed, the backside 115 then refers to the surface of the film layer 210 opposite the substrate 200. When the film layer 210 is removed, the backside 115 refers to the surface of the film layer 205 opposite the substrate 200. When the film layer 205 is removed, the backside 115 refers to the surface of the semiconductor substrate 200 opposite the front side 110.

FIG. 1(b) also depicts a thickness 105 of the portion 120. The film layers 205, 210, 215, 220, as further described below, can be extraneous or can be intentionally deposited on the substrate 200. The film layers 205, 210, 215, 220 are termed "extraneous" or "process-films," when they accumulate and form a layer on the backside of the semiconductor substrate 200 due to the fabrication processes performed on the front side 110. For example—silicon oxide or silicon nitride used in the front side 110 to fabricate the ICs may form process-films on the backside 115. And the film layers 205, 210, 215, 220 can be intentionally deposited to prevent doping contamination. When intentionally deposited, these layers are referred to as "back-seal" films.

The film layers 205, 210, 215 and 220 may also be intentionally formed on the substrate 200 using fabrication processing techniques. In particular, semiconductor wafer fabrication processing can include many process steps, such as surface cleaning, epitaxy, oxidation, diffusion/implantation, photolithography, etching, layer deposition, multiprobe, and backgrinding. These steps often involve reactive chemicals such as hydrofluoric acid, which is particularly useful in etching oxides and nitrides. Furthermore, various manufacturers supply the equipment used in wafer production, and there is no standard on how the equipment interfaces with the wafer. As such, a large variety of handling systems are used that have little in common with each other except that they all handle the wafer. Thus, it is important that the wafer be designed to withstand the fabrication process in order to support high yield and profitability. The problem noted above is in large part addressed by coating the wafer with a thin film or coating. Thus, in some embodiments, the film layers 205, 210, 215, 220 are necessary and intentionally grown on the backside of the wafer as they provide mechanical strength to the wafer for the processes to be performed on the front side 110 to fabricate the IC. For example, the backside of the semiconductor wafer 100 can be covered with silicon nitride, silicon dioxide, polysilicon etc. In some embodiments, the film layers 205, 210, 215, 220 prevent dopants from diffusing out of the substrate 200. The methods of producing silicon nitride include nitriding and low pressure chemical vapor deposition (LPCVD). Other CVD techniques can be used to generate film layers on the backside of the semiconductor wafer.

Figure 1C:
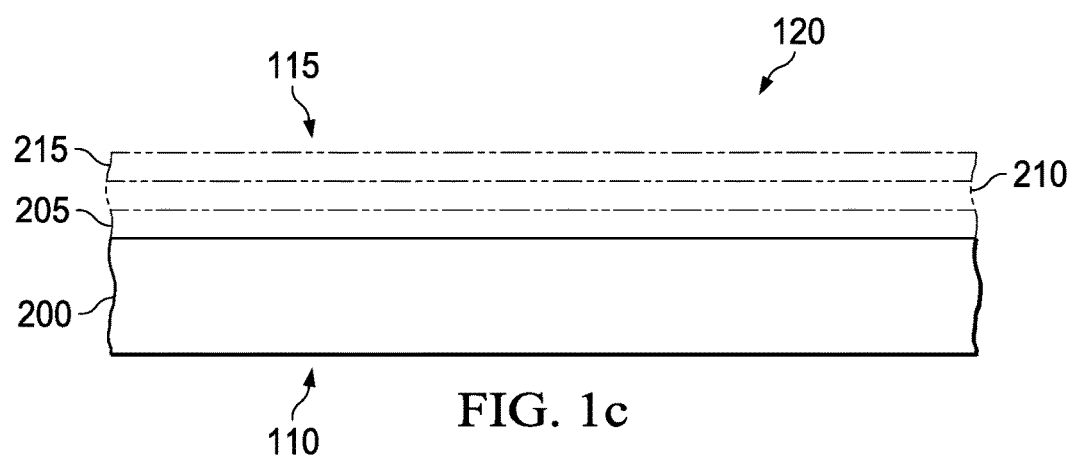
FIG. 1(c)-1(f) are inverted side views of the portion of the semiconductor wafer depicted in FIG. 1(b) and depict the removal of a series of film layers, in accordance with various examples.
Figure 1D:
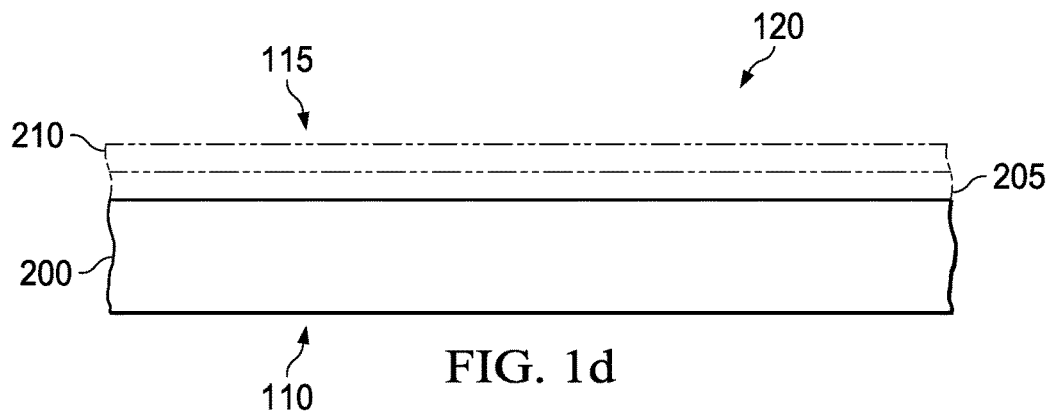
Figure 1E:
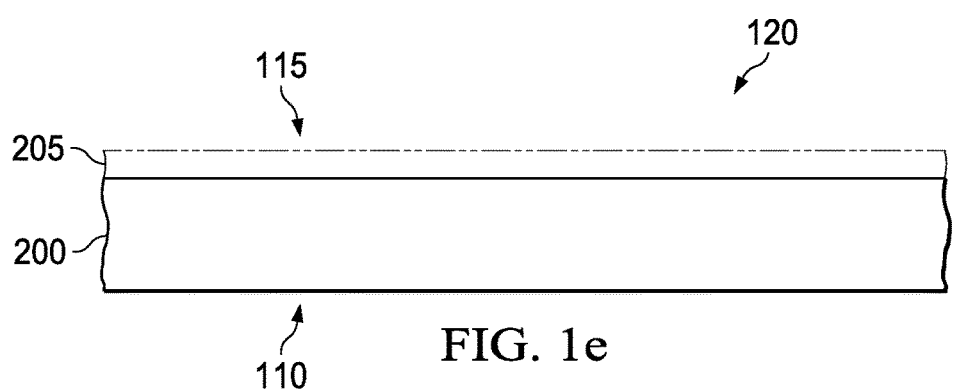
Figure 1F:
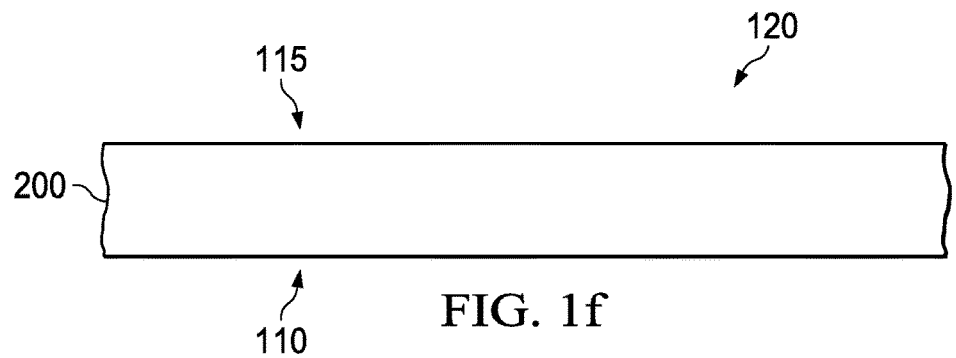
Figure 1G:
FIG. 1(g) is an inverted side view of the portion of the semiconductor wafer depicted in FIG. 1(b) and depicts the grinding of a semiconductor substrate, in accordance with various examples.

Referring again to FIG. 1(b), the film layers 205, 210, 215, 220 can be removed layer-by-layer using a wet-etching process. FIG. 1(c) depicts the portion 120 with the outermost film layer 220 removed by wet etching. Similarly, FIG. 1(d), FIG. 1(e), and FIG. 1(f) depict the portion 120 with the film layers 215, 210, and 205 removed, respectively. In some embodiments, film layers 205, 210, 215, and 220 can include silicon nitride, silicon dioxide, polysilicon, etc. and are wet-etched using chemical baths specific to the outermost film layer (i.e., chemical baths containing chemicals which can selectively etches the outermost layer on the backside 115). Typically, an oxide layer or a silicon nitride layer is wet-etched using a chemical bath including 30%-49%, inclusive, of hydrogen fluoride. A polysilicon layer can be wet-etched using a chemical bath including 60%-70%, inclusive, of nitric acid and 0.5%-1%, inclusive, of hydrogen fluoride. FIG. 1(g) depicts the backside 115 of the substrate 200 having been subjected to a mechanical wheel grinding process to remove a portion of the substrate 200 from the backside 115. The amount of the substrate 200 that is removed is application-specific and may be determined as is suitable.

Figure 2:
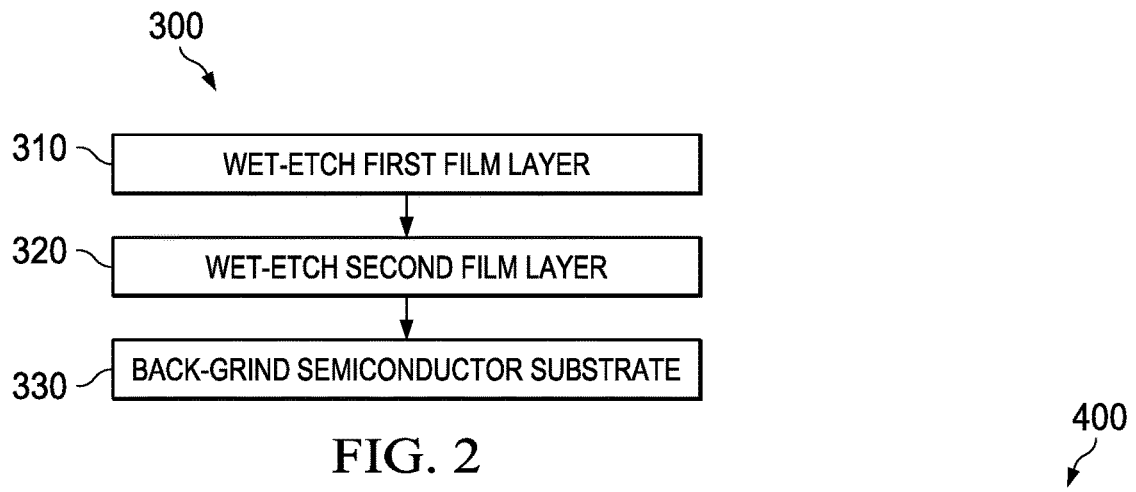
FIG. 2 is an illustrative flowchart of a method for thinning a semiconductor wafer, in accordance with various embodiments.

FIG. 2 depicts a method 300 for thinning a semiconductor wafer, such as the portion 120 depicted in FIG. 1(b). The method 300 disclosed in FIG. 2 is now described in tandem with FIG. 1(b). The method 300 generally includes wet-etching all the film layers 205, 210, 215, 220 from the backside 115 and then mechanically grinding the semiconductor substrate 200 from the backside 115. Wet-etching can be done using various different processes as would be familiar to one of ordinary skill in the art. Common examples include bath etch, spin etch, etc. As such, although the following discussion assumes wet-etching done using a chemical bath, the following principles may equally apply to wet-etching done using different techniques (e.g., spin etch, splash etch, bubble etch, chemical etch, etc.).

In some embodiments, the number of film layers on the semiconductor substrate 200 can vary and may not be present in the same number as depicted in FIG. 1(b), as the number of film layers depends on the fabrication processes to be performed on the front side 110 of the semiconductor substrate 200. In some embodiments, there are more film layers than shown in FIG. 1(b). In other embodiments, the number of film layers is fewer than the number of film layers shown in FIG. 1(b). The method 300 may be modified as necessary to wet-etch some or all film layers formed on a particular semiconductor substrate 200.

The method 300 begins in step 310 with wet-etching a first film layer of the plurality of film layers 205, 210, 215, 220 stacked on the backside of the semiconductor substrate 200 using a first chemical. The first layer to be wet-etched will be the outermost layer, and in this embodiment the outermost layer is marked 220. Consider, as an example, that the film layer 220 is a silicon nitride layer. The silicon nitride layer can be wet-etched using a chemical bath including 30-49%, inclusive, of hydrogen fluoride. In other embodiments, the film layer 220 is an oxide layer which can also be wet-etched using a chemical bath including 30-49% hydrogen fluoride, inclusive. In another embodiment, the film layer 220 may be a polysilicon layer which can be wet-etched using a chemical bath including 60-70% nitric acid, inclusive and 0.5-1% hydrogen fluoride, inclusive. Wet-etching of the film layer 220 may continue until the film layer 220 is completely removed.

The method 300 continues in step 320 with wet-etching a second film layer. With respect to FIG. 1(b), the film layer 215 is the second layer. The second layer can be an oxide layer, a silicon nitride layer, a poly-silicon layer, etc. Wet-etching an oxide layer and a silicon nitride layer can utilize a chemical bath including 30-49%, inclusive, of hydrogen fluoride. A polysilicon layer can be wet-etched using a chemical bath including 60-70% nitric acid, inclusive and 0.5-1% hydrogen fluoride, inclusive. As noted above, the number of film layers can vary. In some embodiments, there are more than two film layers on the backside of the semiconductor wafer, as depicted in FIG. 1(b). A similar wet-etching process can be used to remove such additional film layers. In some embodiments, depending on the chemical composition of the film layer, a chemical bath including 30-49% hydrogen fluoride, inclusive or 60-70% nitric acid, inclusive and 0.5-1% hydrogen fluoride, inclusive can be used to selectively wet-etch the layers 210 and 205.

As mentioned above, a reduction in the thickness of the wafer 100 is achieved by removing the film layers by wet-etching and by removing a portion of the silicon substrate 200 by mechanical wheel grinding. Step 310 and 320 remove extraneous film layers (e.g., film layers 205, 210, 215 and 220) from the semiconductor substrate 200. Once the silicon substrate is exposed, the method of claim 300 further continues in step 330 with backgrinding the semiconductor substrate 200 (FIG. 1(b)). Backgrinding is performed to remove a portion of the semiconductor substrate 200. In some embodiments, to improve the productivity of the grinding operation, a multi-step grinding operation is performed. The first step of the multi-step grinding operation comprises using a large grit to coarsely grind the semiconductor substrate 200 to remove the bulk of the excess substrate thickness. The degree to which the substrate thickness is reduced is variable and application-dependent. The second step of the multi-step grinding operation comprises using a finer grit to polish the wafer and to accurately grind the substrate to the desired thickness, which, as mentioned, is application-specific. The grinding operation begins on the surface of the substrate 200 previously abutting the film layer 205 (i.e., on the backside 115) and progresses toward the opposing surface of the substrate 200 at the front side 110. In some embodiments, the chemical bath including 60-70% nitric acid, inclusive, and 0.5-1% hydrogen fluoride, inclusive, can be utilized to remove a portion of the substrate 200.

Figure 3:
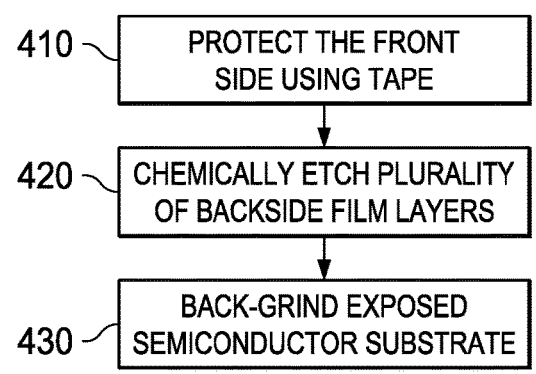
FIG. 3 is another illustrative flowchart of a method for thinning a semiconductor wafer, in accordance with various embodiments.

FIG. 3 depicts a modified wafer thinning method 400. Referring to FIGS. 1(b) and 3, the modified wafer thinning technique includes taping the front side 110, chemically removing the film layers 205, 210, 215, and 220, and mechanically removing (i.e., grinding) a portion of the semiconductor substrate 200. Wet-etching can be done using various different processes, such as bath etch, spin etch, etc. As such, although the present discussion assumes wet-etching performed using a chemical bath, the principles disclosed herein may apply to wet-etching done using different techniques (e.g., spin etch, splash etch, bubble etch, chemical etch, etc.).

The method 400 begins in step 410 with protecting the front side 110 of the semiconductor wafer 100 using tape. Any suitable type of tape, such as UV (ultraviolet)-curable backgrinding tape, or a non-UV tape, may be used to ensure protection against wafer surface damage during backgrinding and to prevent wafer surface contamination caused by infiltration of grinding fluid and/or debris. The method 400 continues in step 420 with chemically etching a plurality of film layers stacked on the substrate 200. As noted above, the number of film layers present on the substrate 200 may depend on the mechanical strength needed by the semiconductor wafer 100 for the processes to be performed on the front side 110 to fabricate the ICs. As noted above, in some cases, the film layers may also be present to avoid doping contamination ("back-seal" films). Additionally, in some cases, the number of film layers present on the substrate 200 depends on the fabrication processes performed on the frontside 110.

The chemical etching of step 420 is selective in nature. In particular, the film layers are selectively etched using chemicals capable of etching each of the film layers 205, 210, 215, and 220. For example, a film layer can be a silicon nitride layer, a silicon oxide layer, a polysilicon layer, etc. Certain chemicals selectively etch—one layer at a time—each of the above-mentioned film layers. For instance, a chemical bath including 30-49% hydrogen fluoride, inclusive, can be used to remove a silicon nitride layer and a silicon oxide layer and a chemical bath including 60-70% nitric acid, inclusive, and 0.5-1% hydrogen fluoride, inclusive, can remove a polysilicon layer. The chemical bath removes the topmost layer and the removal process essentially stops when the topmost layer is removed as the chemical bath used is a selective etchant. Thus, for example, if the topmost layer is silicon nitride, the chemical bath including 30-49% hydrogen fluoride will be utilized, but this chemical bath will cease etching once the silicon nitride layer is removed. Assume, as an example, that after removing the silicon nitride layer, the polysilicon layer becomes the topmost layer. A different chemical bath including 60-70% nitric acid, inclusive, and 0.5-1% hydrogen fluoride, inclusive, can be used to etch the polysilicon layer. In this manner, the step 420 chemically removes the plurality of backside film layers until the semiconductor substrate 200 is exposed. In some embodiments, the chemical bath including 60-70% nitric acid, inclusive, and 0.5-1% hydrogen fluoride, inclusive, can be utilized to remove a portion of the substrate 200.

The method 400 further continues in block 430 with backgrinding the semiconductor substrate 200. As noted above, a reduction in the thickness of the semiconductor wafer 100 is achieved by removing the film layers 205, 210, 215, and 220 by wet-etching and by removing a portion of the substrate 200 by mechanical wheel grinding. Backgrinding is performed using a mechanical grinder and in this embodiment, the backgrinder removes a portion of the semiconductor substrate 200. In some embodiments, to improve the productivity of the grinding operation, a multi-step grinding operation is generally performed. The first step uses a large grit to coarsely grind the wafer and to remove a bulk of the excess substrate thickness. A finer grit is then used in the second step to polish the substrate and to accurately grind the substrate to the desired thickness.

Figure 4:
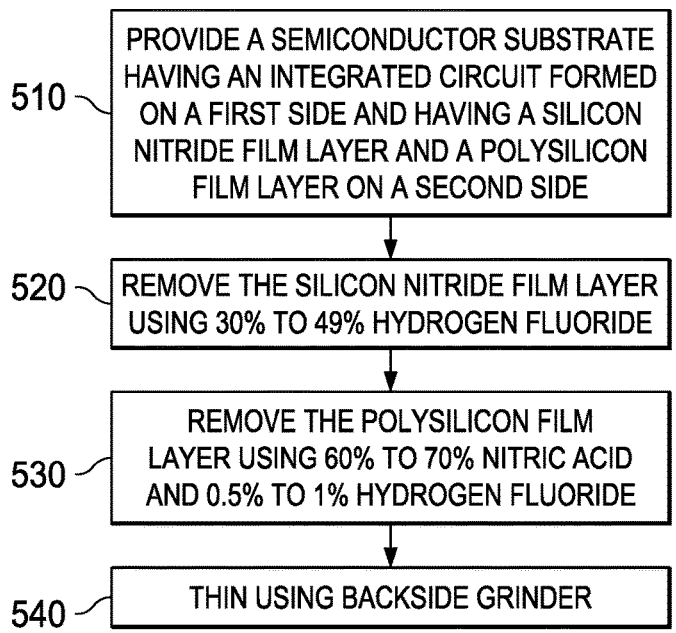
FIG. 4 is yet another illustrative flowchart of a method for thinning a semiconductor wafer, in accordance with various embodiments.

FIG. 4 depicts an illustrative method 500 to wet-etch the backside film layers 205, 210, 215, and 200 and to mechanically grind the substrate 200, and this method 500 is now described in tandem with FIG. 1(b). Step 510 includes providing a semiconductor substrate 200 having ICs formed on the front side 110 and having backside film layers that can include a silicon nitride film layer and a polysilicon film layer. The positions of layers are interchangeable; that is, either of the film layers can be the outermost layer. The method 500 continues in step 520 with removing the silicon nitride film layer using a chemical which can selectively etch the silicon nitride film. For example, a chemical bath including 30-49% hydrogen fluoride, inclusive, can be utilized to remove the silicon nitride layer. After etching the silicon nitride layer, the wet-etching of the exposed layer (e.g., polysilicon film layer) is ineffective with the chemical bath used to etch nitride film. Thus, wet-etching, for practical purposes, is said to have stopped after etching the specific layer that the chemical bath is selected to etch.

The method 500 continues in step 530 with removing the exposed layer, i.e., the polysilicon layer, using a different chemical bath including 60-70% nitric acid, inclusive, and 0.5-1% hydrogen fluoride, inclusive. The method of claim 500 continues in step 540 with backgrinding the exposed semiconductor substrate 200. Backgrinding is performed using a mechanical grinder to remove a portion of the semiconductor substrate 200. In some embodiments, to improve the productivity of the grinding operation, a multi-step grinding operation is generally performed. The first step uses a large grit to coarsely grind the substrate and to remove a bulk of the excess substrate thickness. A finer grit is used in the second step to polish the substrate and to accurately grind the substrate to the desired thickness. In some embodiments, the chemical bath including 60-70% nitric acid, inclusive, and 0.5-1% hydrogen fluoride, can be utilized to remove a portion of the substrate 200.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A method of forming an integrated circuit, comprising:
providing a semiconductor substrate having an electronic circuit formed on a first side of the substrate, and having a first material layer located over a second side of the substrate and a second material layer located between the first material layer and the second side;
removing at least a portion of the first material layer using a first chemical etching process, thereby exposing the second material layer;
removing at least a portion of the second material layer using a second chemical etching process; and
then mechanically removing a portion of the substrate from the second side.

2. The method of claim 1, wherein removing at least a portion of the second material layer at least partially exposes the second side of the substrate.

3. The method of claim 1, wherein the first material layer comprises silicon nitride and the first chemical etching process includes exposing the silicon nitride to a wet-etching bath.

4. The method of claim 3, wherein the wet-etching bath includes 30%-49% hydrogen fluoride, inclusive.

5. The method of claim 1, wherein the first chemical etching process removes the first material layer at a greater rate than the first chemical etching process removes the second material layer.

6. The method of claim 1, wherein the first material layer comprises polysilicon and the first chemical etching process includes exposing the polysilicon to a wet-etching bath.

7. The method of claim 6, wherein the wet-etching bath includes 60%-70% nitric acid, inclusive and 0.5%-1% hydrogen fluoride, inclusive.

8. The method of claim 6, wherein the first material layer includes a silicon oxide sublayer and the first chemical etching process further includes removing at least a portion of the silicon oxide sublayer.

9. The method of claim 1, wherein the first chemical etching process includes wet-etching the first material layer with a solution comprising 60%-70% nitric acid, inclusive and 0.5%-1% hydrogen fluoride, inclusive.

10. The method of claim 1, wherein the first chemical etching process includes wet-etching the first material layer with a solution comprising 30%-49% hydrogen fluoride, inclusive.

11. The method of claim 1, wherein the second first material layer includes polysilicon, and the first chemical etching process removes the first material layer and stops on the polysilicon.

12. The method of claim 1, wherein the first material layer includes silicon nitride, and the first chemical etching process removes the first material layer and stops on the silicon nitride.

13. The method of claim 1, wherein the first and second material layers are derived from a plurality of microfabrication processes performed on the first side of the semiconductor substrate.

14. The method of claim 1, further comprising protecting the first side with tape while mechanically removing the portion of the substrate from the second side.

15. The method of claim 1, wherein the mechanically removing includes backgrinding the second side using a mechanical grinding wheel.

* * * * *